United States Patent [19]

Maeda et al.

[11] Patent Number: 5,736,921
[45] Date of Patent: Apr. 7, 1998

[54] MAGNETORESISTIVE ELEMENT

[75] Inventors: Atsushi Maeda; Satoru Oikawa; Minoru Kume, all of Osaka, Japan

[73] Assignee: Sanyo Electric Co., Ltd., Osaka, Japan

[21] Appl. No.: 406,670

[22] Filed: Mar. 20, 1995

[30] Foreign Application Priority Data

Mar. 23, 1994 [JP] Japan ................ 6-052055

[51] Int. Cl.[6] ........................................ H01L 43/00
[52] U.S. Cl. .............................. 338/32 R; 360/113
[58] Field of Search .................. 427/128; 338/32 R, 338/32 H; 360/113; 428/611

[56] References Cited

U.S. PATENT DOCUMENTS

| | | | |
|---|---|---|---|
| 2,979,668 | 4/1961 | Dunlap, Jr. .................. | 330/250 |
| 3,019,125 | 1/1962 | Eggenberger et al. | |
| 3,567,525 | 3/1971 | Graham et al. | |
| 3,975,772 | 8/1976 | Lin. | |
| 4,187,553 | 2/1980 | Ahn et al. | |
| 4,516,180 | 5/1985 | Narishige et al. | |
| 4,623,867 | 11/1986 | Lundquist et al. | |
| 4,935,311 | 6/1990 | Nakatani et al. .................. | 428/611 |

(List continued on next page.)

FOREIGN PATENT DOCUMENTS

| | | |
|---|---|---|
| 58-36406 | 8/1983 | Japan. |
| 59-11522 | 1/1984 | Japan. |
| 59-63019 | 4/1984 | Japan. |
| 59-87617 | 5/1984 | Japan. |
| 60-89809 | 5/1985 | Japan. |
| 62-97118 | 5/1987 | Japan. |
| 3-257977 | 11/1991 | Japan. |
| 4-218982 | 8/1992 | Japan. |
| 4-358310 | 12/1992 | Japan. |
| 4-360009 | 12/1992 | Japan. |
| 5-114761 | 5/1993 | Japan. |
| 6-101000 | 4/1994 | Japan. |
| 6-169117 | 6/1994 | Japan ................ 338/32 R |
| 6-318515 | 11/1994 | Japan. |

OTHER PUBLICATIONS

A. E. Berkowitz et al. "Giant Magnetoresistance in Heterogeneous Cu–Co Alloys" Physical Review Letters, vol. 68, No. 25, Jun. 1992, pp. 3745–3748.

A. Chaiken et al. "Low–field spin–valve magnetoresistance in Fe–Cu–Co sandwiches" Appl. Phys. Lett. 59 Jul. 1991, pp. 240–242.

B. Dieny et al. "Giant magnetoresistance of magnetically soft sandwiches: Dependence on temperature and on layer thicknesses" Physical Review B, Jan. 1992, pp. 806–813.

(List continued on next page.)

Primary Examiner—Teresa J. Walberg
Assistant Examiner—Karl Easthom
Attorney, Agent, or Firm—W. G. Fasse; W. F. Fasse

[57] ABSTRACT

A magnetoresistive element includes a substrate, a magnetoresistive film arranged on the substrate and prepared from a non-magnetic conductive metal film containing grains consisting of a ferromagnetic metal atom or a ferromagnetic metal alloy dispersed therein so that the grain concentration is varied along the film thickness direction, a pair of current feeding electrodes arranged on the magnetoresistive film, and a pair of voltage reading electrodes arranged on the magnetoresistive film.

24 Claims, 9 Drawing Sheets

U.S. PATENT DOCUMENTS

| | | | |
|---|---|---|---|
| 4,949,039 | 8/1990 | Grüberg . | |
| 5,117,321 | 5/1992 | Nakanishi et al. . | |
| 5,134,533 | 7/1992 | Friedrich et al. . | |
| 5,159,513 | 10/1992 | Dieny et al. . | |
| 5,164,025 | 11/1992 | Hasegawa . | |
| 5,187,628 | 2/1993 | Kanai et al. . | |
| 5,196,821 | 3/1993 | Partin et al. . | |
| 5,206,590 | 4/1993 | Dieny et al. . | |
| 5,243,316 | 9/1993 | Sakakima et al. . | |
| 5,268,043 | 12/1993 | McCowen | 428/611 |
| 5,277,991 | 1/1994 | Satomi et al. . | |
| 5,287,553 | 2/1994 | Ahn et al. . | |
| 5,296,987 | 3/1994 | Anthony et al. . | |
| 5,304,975 | 4/1994 | Saito et al. . | |
| 5,313,186 | 5/1994 | Schuhl et al. . | |
| 5,324,593 | 6/1994 | Lal et al. | 428/611 |
| 5,365,212 | 11/1994 | Saito et al. | 338/32 R |
| 5,366,815 | 11/1994 | Araki et al. . | |
| 5,422,621 | 6/1995 | Gambino et al. . | |
| 5,425,819 | 6/1995 | Oohashi et al. . | |
| 5,432,734 | 7/1995 | Kawano et al. . | |
| 5,442,508 | 8/1995 | Smith . | |
| 5,462,809 | 10/1995 | Berkowitz | 428/611 |
| 5,474,833 | 12/1995 | Etienne et al. . | |
| 5,510,172 | 4/1996 | Araki et al. . | |
| 5,527,626 | 6/1996 | Gijs et al. . | |
| 5,530,608 | 6/1996 | Aboaf et al. . | |

OTHER PUBLICATIONS

D. H. Mosca et al. "Oscillatory interlayer coupling and giant magnetoresistance in Co/Cu multilayers" Journal of Magnetism and Magnetic Materials 94 (1991), pp. L.1–L.5.

Dieny et al. "Giant Magnetoresistance in Soft Ferromagnetic Layers" Physical Review Condensed Matter, 43 (1991) Jan. vol. 1, Part B.

J. Smyth et al. "Hysteresis in Lithographic Arrays . . . ", J. Appl. Phys. Apr. 1994, vol. 69, No. 8, pp. 5262–5266.

Shinjo et al."Metallic Superlattices—Artificially Structured Materials", ; Studies in physical and theoretical Chemistry 49; 1987.

Maeda et al.; "Magnetoresistance characteristics of grain-–type alloy thin films of various compositions", J. Phys.: Condens. Matter 5 (1993) 6745–6752.

S. H. Liou et al. "The process–controlled magnetic properties of nanostructured Co/Ag composite films" J. Appl. Phys. 70 Nov. 91 (Magnetism of Fine Particles) pp. 5882–5884.

P. Grünberg et al., Interlayer Exchange, Magnetotransport and Magnetic Domains in Fe/Cr Layered Structures, Journal of Magnetism and Magnetic Materials, 1992, pp. 1734–1738.

S. Demokritov et al., Evidence for Oscillations in the Interlayer Coupling of Fe Films Across Cr Films from Spin Waves and M(H) Curves, Europhysics Letters, Aug. 1991, pp. 881–886.

Hideo Fujiwara et al. Analytical Model of Giant MR in Multilayers With Biquadratic Coupling, Journal of the Magnetism and Magnetic Materials, 1994, pp. L 23–L29.

Martin Parker et al., Biquadratic Effects in Magnetic Multilayers With Low–Field Giant MR, Journal of the Magnetics Society of Japan, vol. 18, 1994, pp. 371–377.

K. Inomata et al. Giant Magnetoresistance Effect and Magnetic Anisotropy in $CO_9Fe/Cu/CO_9Fe$ Trilayers on MgO(110) Substrates, Journal of Magnetism and Magnetic Materials 137 (1994) 257–263.

Dieny et al. "Giant Magnetoresistance in Soft Ferromagnetic Multilayers" Physical Review Condensed Matter, 43 (1991) Jan. vol. 1, Part B, pp. 1297–1300.

J. Smyth et al. "Hysteresis in Lithographic Arrays . . . ", J. Appl. Phys. Apr. 1991, vol. 69, No. 8, pp. 5262–5266.

MAGNETORESISTIVE ELEMENT

CROSS REFERENCE TO RELATED APPLICATIONS:

This application is related to copending application U.S. Ser. No. 08/326,731 filed Oct. 20, 1994 entitled Magnetoresistance Effect Element and to copending application U.S. Ser. No. 08/216,185 filed Mar. 22, 1994 entitled Magnetoresistance-Effect Element.

BACKGROUND OF THE INVENTION

1. Field of the Invention

The present invention relates to a magnetoresistive element (MR element) which can be used in a magnetoresistive head (MR head), a magnetoresistive sensor (MR sensor) or the like.

2. Description of the Background Art

An MR element is adapted to detect a change in electric resistance of a magnetic film which is caused by application of a magnetic field, for measuring the magnetic field strength and any change thereof, and must have a high magnetoresistance ratio and small operating magnetic field strength.

In a conventional MR head which is disclosed in Japanese Patent Publication No. 58-36406 (1983), an NiFe alloy (permalloy) is employed as a magnetoresistive magnetic material.

On the other hand, the journal "Physical Review Letters", Vol. 68, No. 25, 22 June 1992, pp. 3745 to 3748 describes a magnetoresistive material consisting of Co atoms and eutectic Cu atoms which are mixed with the Co atoms not in a solid phase but in a liquid phase. This magnetoresistive material exhibits a high magnetoresistance ratio of at least 10% at an ultra-low temperature of 10 K.

However, the permalloy is not preferable as the material for an MR head since it causes noise (Barkhausen noise) originating from a Barkhausen effect. Further, the permalloy has a small magnetoresistance ratio (MR ratio) of 2 to 3%, which is insufficient for the material for an MR sensor.

In the aforementioned magnetoresistive material consisting of Co and Cu, on the other hand, the magnetoresistance ratio is reduced to about 6 to 7% and the operating magnetic field strength is extremely increased to about 6000 Oe at the room temperature.

SUMMARY OF THE INVENTION

An object of the present invention is to provide a magnetoresistive element which has a high magnetoresistance ratio and small operating magnetic field strength, with no occurrence of Barkhausen noise.

The magnetoresistive element according to the present invention comprises a substrate, a magnetoresistive element which is formed on the substrate and provided with a non-magnetic conductive metal film matrix containing grains, consisting of a ferromagnetic metal atom matrix or a ferromagnetic metal alloy, dispersed therein so that the grain concentration is varied along the film thickness direction, a pair of current feeding electrodes which are formed on the magnetoresistive film, and a pair of voltage reading electrodes which are formed on the magnetoresistive film.

According to a first mode of the present invention, the non-magnetic conductive metal and the ferromagnetic metal atom or the ferromagnetic metal alloy forming the magnetoresistive film are selected in a combination of materials which are insoluble with each other in both solid and liquid phases. Such a relationship is referred to as "two-melt system" in the field of metallic superlattice.

When the ferromagnetic metal atom is Co, then Ag or Pb may be employed as the non-magnetic conductive metal. In this case, V, Cr or Mn may be added to Co, for alternatively preparing grains consisting of a ferromagnetic metal alloy. More preferably, Co is selected for the ferromagnetic metal atom, while Ag is selected for the non-magnetic conductive metal.

When the ferromagnetic metal atom is Fe, on the other hand, then Ag, Bi, Mg, and Pb may be selected as the non-magnetic conductive metal. Alternatively, it is possible to disperse grains consisting of a ferromagnetic metal alloy prepared by adding Co, Ni, Cu or Zn to Fe. Preferably, an NiFe alloy is selected as the ferromagnetic metal alloy, while Ag is selected for the non-magnetic conductive metal.

When the ferromagnetic metal atom is Ni, further, then Ag can be employed as the non-magnetic conductive metal. Alternatively, it is possible to disperse grains consisting of a ferromagnetic metal alloy prepared by adding V, Cr or Mn to Ni.

According to a second mode of the present invention, the ferromagnetic metal atom or the ferromagnetic metal alloy and the non-magnetic conductive metal can be selected from materials having the so-called eutectic relation, which are soluble with each other not in a solid phase but in a liquid phase. Co and Cu can be selected for the ferromagnetic metal atom and the non-magnetic conductive metal respectively as the materials having such relation.

When Co grains are dispersed in Ag, a high magnetoresistance ratio is attained at a composition ratio with 54 to 88 atomic percent of Ag. Therefore, it is preferable to vary the grain concentration along the film thickness direction in a range maintaining such a composition ratio for a high magnetoresistance ratio. When Fe grains are dispersed in a film of non-magnetic metal atom, on the other hand, a high magnetoresistance ratio is attained in the range of 60 to 85 atomic percent of the non-magnetic metal atom. Therefore, it is preferable to vary the grain concentration along the film thickness direction in a range maintaining such a composition ratio for attaining a high magnetoresistance ratio.

According to the present invention, the grain concentration in the magnetoresistive film may be varied along the film thickness direction substantially continuously or substantially stepwise.

In the magnetoresistive film provided in the magnetoresistive element according to the present invention, the grains consisting of ferromagnetic metal atom or a ferromagnetic metal alloy are dispersed in the non-magnetic conductive metal film. The magnetization state of the grains is gradually changed from a random-directional arrangement to a ferromagnetic arrangement as the strength of an applied magnetic field is increased. The state of scattering of conduction electrons which are transmitted among atoms of the non-magnetic conductive metal is remarkably varied with the magnetization state of the grains. In the magnetoresistive film provided with the non-magnetic conductive metal film and the ferromagnetic grains dispersed therein, therefore, the magnetoresistance ratio is increased. Further, each grain is so small in size that a single domain structure is formed and therefore Barkhausen noise does not occur.

According to the present invention, further, the grain concentration is varied along the film thickness direction in such a magnetoresistive film. In the magnetoresistive film having such a change or variation of the grain concentration, a portion having a high magnetic grain concentration conceivably serves a soft magnetic material function with respect or relative to that film portion having low magnetic grain concentration. Due to the soft magnetic material function, therefore, the portion having high magnetic grain concentration is conceivably magnetically coupled with that having low magnetic grain concentration, so that the magnetization state of the latter is changed following that of the former even upon weak magnetic field change. In the magnetoresistive element according to the present invention, the operating magnetic field strength can conceivably be reduced as the result of the just described effect.

Further, magnetoresistance change is also increased in the magnetoresistive element according to the present invention. Namely, the magnetoresistive film having a magnetic grain concentration which is varied along the film thickness direction according to the present invention exhibits higher magnetoresistance change as compared with a magnetoresistive film containing homogeneously dispersed magnetic grains. However, the reason why the magnetoresistive film according to the present invention exhibits such high magnetoresistance change has not yet been clarified in detail.

According to the present invention, it is possible to provide a magnetoresistive element which has a high magnetoresistance ratio at room temperature and small operating magnetic field strength without Barkhausen noise. Therefore, the magnetoresistive element according to the present invention is usefully applied to a magnetoresistive head or a magnetoresistive sensor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
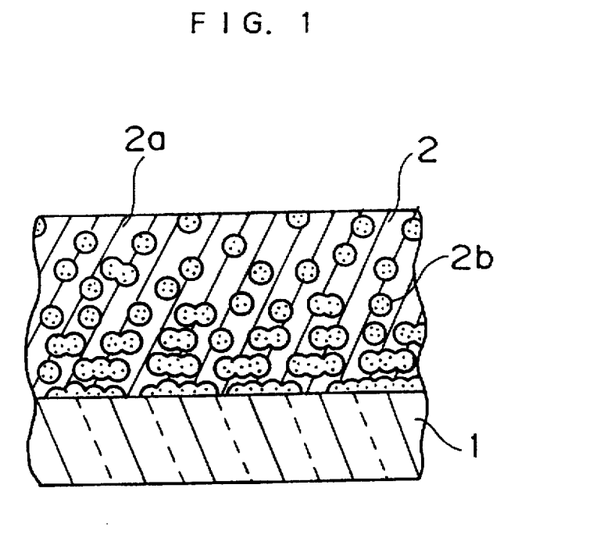
FIG. 1 is a typical sectional view showing a magnetoresistive film provided in a magnetoresistive element according to a first embodiment of the present invention.

FIG. 1 is a typical sectional view showing a magnetoresistive film which is provided in a magnetoresistive element according to a first embodiment of the present invention. Referring to FIG. 1, a magnetoresistive film 2 having a thickness of 1000 Å is formed on a non-magnetic substrate 1 of glass. This magnetoresistive film 2 is made of an NiFe alloy which is a ferromagnetic metal alloy, and non-magnetic conductive metal atoms of Ag, which is insoluble with the alloy in both of solid and liquid phases. This magnetoresistive film 2 is formed in such a state that grains 2b consisting of the NiFe alloy are dispersed in an Ag film 2a. The concentration of the grains 2b is substantially continuously reduced along the film thickness direction. In other words, the number of the grains 2b is substantially continuously reduced upwardly from the substrate 1.

The magnetoresistive film 2 shown in FIG. 1 can be prepared by electron beam deposition, for example, under conditions of an initial degree of vacuum of $4 \times 10^{-7}$ Torr and a substrate temperature of room temperature, for example.

First, the substrate 1 is shielded with a shutter, and the output of an electron beam is controlled at a constant level with a deposition source of an $Ni_{80}Fe_{20}$ alloy consisting of 80 percent by weight of Ni and 20 percent by weight of Fe, so that the deposition rate onto the substrate 1 is 1 Å/sec. (constant).

Then, the shutter is opened so that Ni and Fe are continuously deposited on the substrate 1 with the constant electron beam output, while the output of another electron beam with an Ag deposition source is continuously increased to a value for attaining an Ag deposition rate of 0.9 Å/sec. for depositing Ag on the substrate 1. Thereafter the shutter is closed, to obtain the magnetoresistive film 2 in a prescribed thickness.

A thin film which is formed by deposition or the like is in a liquid phase state immediately after deposition of the thin film components, and thereafter enters a solid phase state. The NiFe alloy and Ag are insoluble with each other in both the solid and liquid phases, and hence the grains 2b of the NiFe alloy are dispersed in the Ag film 2a forming the magnetoresistive film 2. The Ag deposition rate is increased with i.e. during the formation of the thin film, whereby the concentration of the grains 2b is continuously reduced along the film thickness direction.

Figure 2:
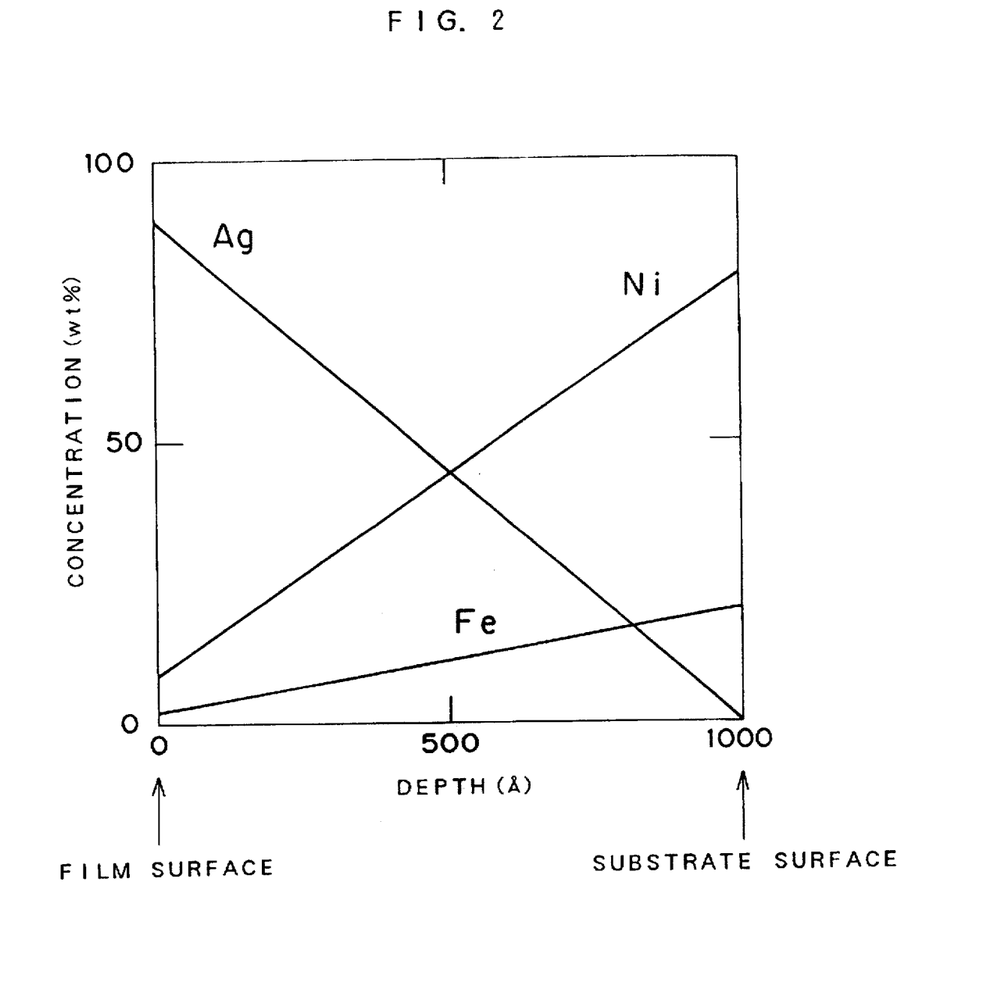
FIG. 2 illustrates concentration values of elements forming the magnetoresistive film shown in FIG. 1 along the film thickness direction, measured by Auger electron spectroscopy.

FIG. 2 illustrates the result of a composition analysis that was carried out on a sample of the magnetoresistive film 2 provided in the embodiment shown in FIG. 1, along the film thickness direction by Auger electron spectroscopy. The axis of ordinates shows concentration values (percent by weight) of the respective atoms, and the axis of abscissas shows depths (Å) of the magnetoresistive film 2 from its surface.

As clearly understood from FIG. 2, the concentration of the NiFe alloy is continuously reduced along the film thickness direction, i.e., upwardly from the substrate 1 toward the upper or outer surface of the film 2. It is also understood that the grains 2b are entirely made of the $Ni_{80}Fe_{20}$ alloy. It is further understood that the weight ratio of $Ni_{80}Fe_{20}$ to Ag is 20:80 on the outermost surface of the magnetoresistive film 2.

It has been recognized by observation with an electron microscope that the grains 2b of the NiFe alloy provided in the magnetoresistive film 2 have diameters of several 10 Å.

Figure 3:
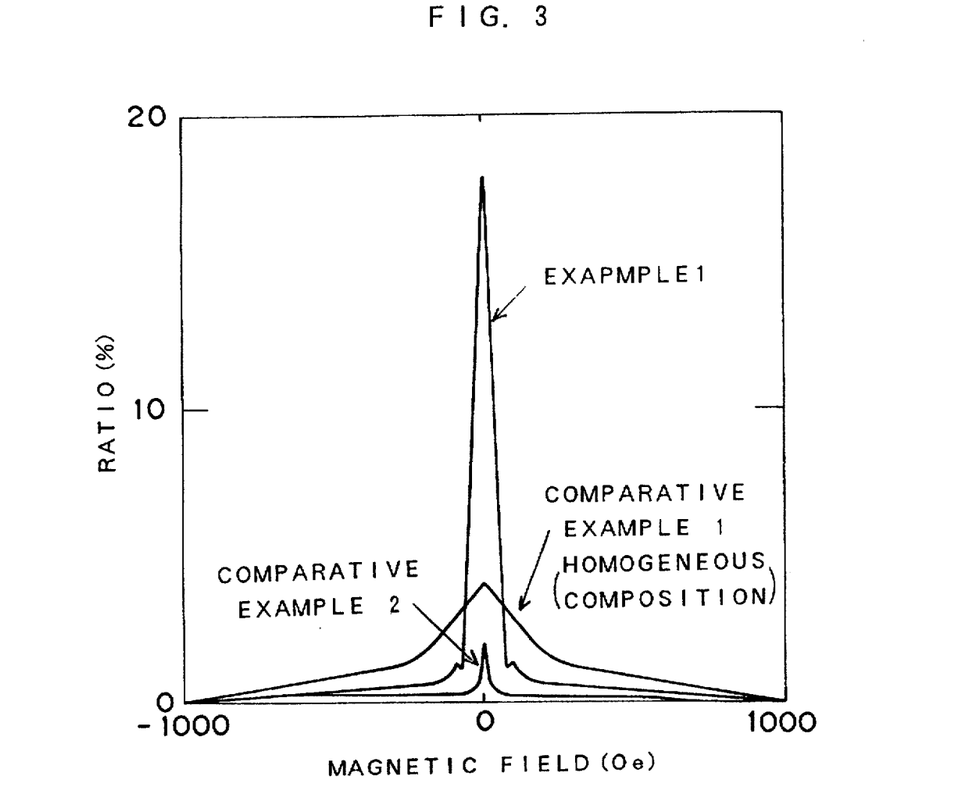
FIG. 3 illustrates relations between external magnetic fields and magnetoresistance ratios in Example 1 according to the embodiment shown in FIG. 1 and comparative examples 1 and 2.

For the purpose of comparison, a magnetoresistive film (comparative example 1) was prepared so that grains of an $Ni_{80}Fe_{20}$ alloy were present in an Ag film in a homogeneous concentration of 20 percent by weight. Further, another magnetoresistive film (comparative example 2) was prepared from a single component of an $Ni_{80}Fe_{20}$ alloy. For the magnetoresistive films of the aforementioned sample (Example 1) according to the embodiment and comparative examples 1 and 2, magnetoresistance values were measured by a four-probe method at room temperature with external magnetic fields which were varied in the range of −1000 to +1000 Oe, to obtain magnetoresistance ratios (MR ratio= ΔR/R) from the results of the measurement. FIG. 3 shows the results, and Table 1 shows the maximum MR ratios and operating magnetic fields.

The MR ratio is defined as $(R(H)-R_{min})/R_{min} \times 100$ (%), where $R(H)$ and $R_{min}$ represent the resistance value at applied magnetic field strength H and the minimum resistance value respectively.

TABLE 1

|  | Example 1 | Comparative Example 1 | Comparative Example 2 |
| --- | --- | --- | --- |
| Maximum MR Ratio (%) | 18 | 6.5 | 2 ~ 3 |
| Operating Magnetic Field (Oe) | 52 | 2300 | ~10 |

As clearly understood from FIG. 3, the magnetoresistive element according to Example 1 of the present invention exhibits an extremely high MR ratio. As clearly understood from Table 1, further, the maximum MR ratio of Example 1 is about 18%, which is remarkably larger as compared with those of about 7% and about 3% of comparative examples 1 and 2. It is also understood that the operating magnetic field of Example 1 is about 50 Oe, which is sufficiently smaller than that of about 2300 Oe of comparative example 1, but which is slightly larger than that of about 10 Oe of comparative example 2. In addition, the maximum MR ratio and the operating magnetic field of the magnetoresistive film according to Example 1 are larger and smaller than those of the aforementioned conventional magnetoresistive film consisting of Co and Cu respectively.

No Barkhausen noise was caused in the magnetoresistive element according to Example 1.

Figure 4:
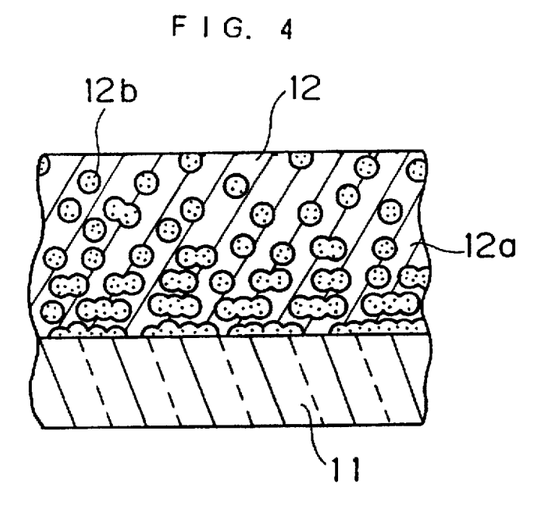
FIG. 4 is a typical sectional view showing a magnetoresistive film provided in a magnetoresistive element according to a second embodiment of the present invention.

FIG. 4 is a typical sectional view showing a magnetoresistive film provided in a magnetoresistive element according to a second embodiment of the present invention. Referring to FIG. 4, a magnetoresistive film 12 having a thickness of 1000 Å is formed on a non-magnetic substrate 11 of glass. This magnetoresistive film 12 is made of Co atoms which are ferromagnetic metal atom, and Ag which is a non-magnetic conductive metal. Co and Ag are insoluble with each other in both of solid and liquid phases.

The magnetoresistive film 12 is formed by an Ag film 12a and grains 12b of Co which are dispersed therein. The concentration of the grains 12b, i.e., the number of the grains 12b is substantially continuously reduced upwardly from the substrate 11, i.e., along the film thickness direction.

The magnetoresistive film 12 shown in FIG. 4 can be prepared by electron beam deposition, for example, under conditions of an initial degree of vacuum of $4 \times 10^{-7}$ Torr and a substrate temperature of room temperature, for example.

First, the substrate 11 is shielded with a shutter, and the output of an electron beam is controlled at a constant level so that the Co deposition rate onto the substrate 11 is constantly at 1 Å/sec.

Then, the shutter is opened so that Co is continuously deposited on the substrate 11 with the constant electron beam output, while the output of another electron beam is continuously increased from zero to a value attaining an Ag deposition rate of 0.9 Å/sec. for depositing Ag on the substrate 11. Thereafter the shutter is closed, to obtain the magnetoresistive film 12 in a prescribed thickness.

Co and Ag are insoluble with each other in both of solid and liquid phases, and hence the magnetoresistive film 12 is formed in such a state that the grains 12b consisting of Co are dispersed in the Ag film 12a, while the concentration of the grains 12b is continuously reduced from the substrate 12 along the film thickness direction.

Figure 5:
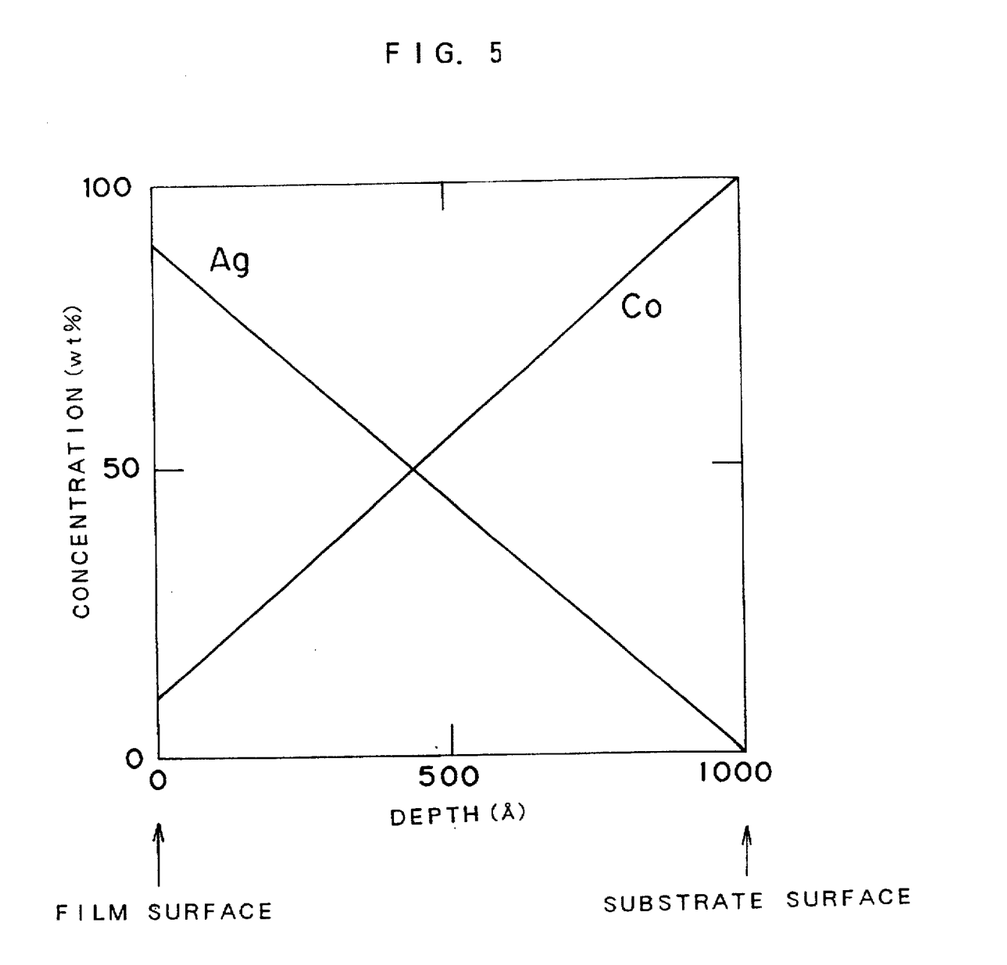
FIG. 5 illustrates concentration values of elements forming the magnetoresistive film shown in FIG. 4 along the film thickness direction, measured by Auger electron spectroscopy.

FIG. 5 illustrates the result of a composition analysis that was carried out on a sample of the magnetoresistive film according to the second embodiment, along the film thickness direction by Auger electron spectroscopy. The axis of ordinates shows concentration values (percent by weight) of the respective atoms, and the axis of abscissas shows depths (Å) of the magnetoresistive film 12 from its surface.

As clearly understood from FIG. 5, the Co concentration is substantially continuously and substantially linearly reduced along the film thickness direction, i.e., upwardly from the substrate 11. It is also understood that the weight ratio of Co to Ag is 20:80 on the outermost surface of the magnetoresistive film 12.

It has been recognized by observation with an electron microscope that the grains 12b consisting of Co provided in the magnetoresistive film 12 have diameters of several 10 Å.

Figure 7:
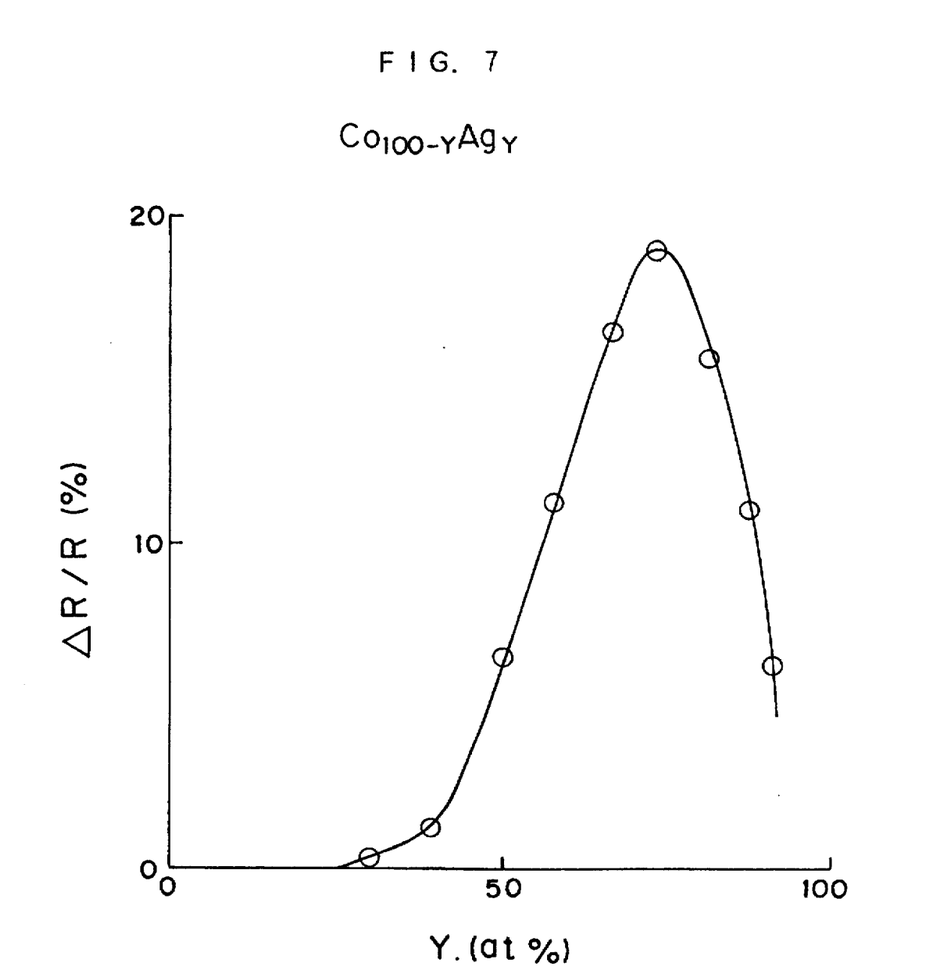
FIG. 7 illustrates relations between composition ratios and magnetoresistance ratios in magnetoresistive films having Co grains homogeneously dispersed in FIG. 8 is a sectional view showing an exemplary magnetoresistive element according to the present invention.

For the purpose of comparison, a magnetoresistive film (comparative example 3) was prepared so that grains consisting of Co were present in an Ag film entirely in a homogeneous concentration of 20 percent by weight. FIG. 7 illustrates relations between Ag contents and MR ratios in such magnetoresistive films containing homogeneously distributed grains. It is clearly understood from FIG. 7 that the highest MR ratio is attained when the Co content is 20 percent by weight. Therefore, the magnetoresistive film according to comparative example 3 exhibits the highest MR ratio among those containing homogeneously dispersed CoAg grains.

Figure 6:
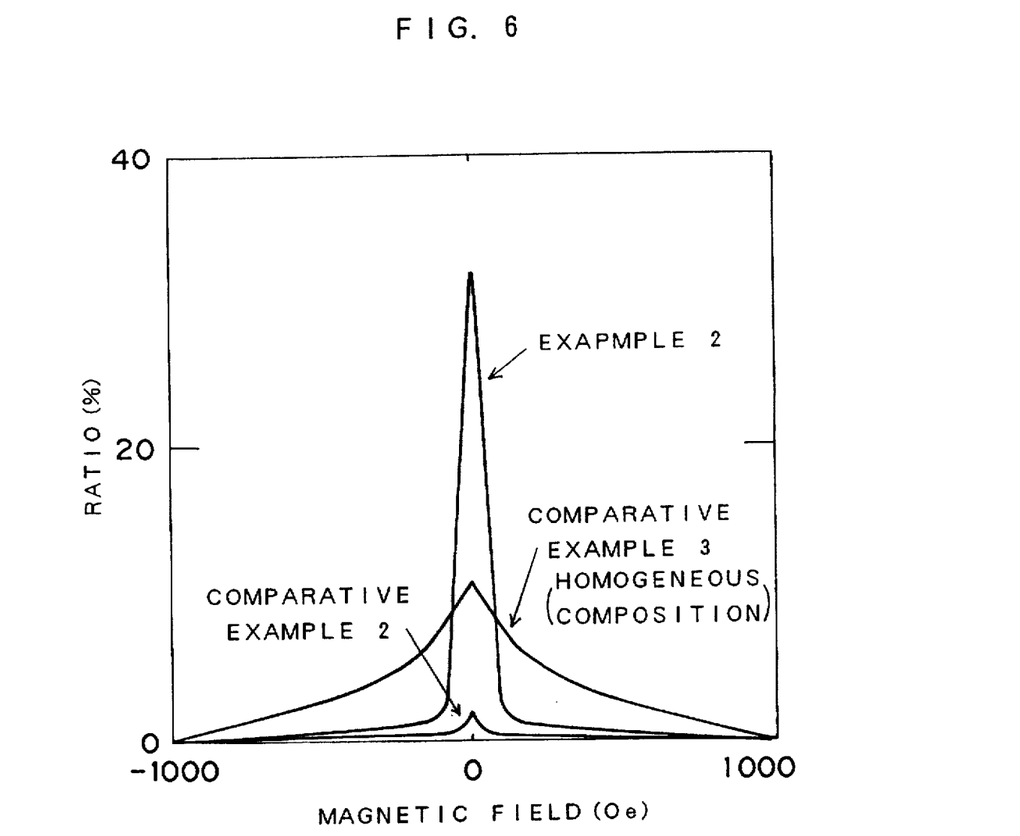
FIG. 6 illustrates relations between external magnetic fields and magnetoresistance ratios in Example 2 according to the embodiment shown in FIG. 4 and comparative examples 2 and 3.

For the magnetoresistive films of the aforementioned sample (Example 2) according to the second embodiment of the present invention and comparative example 3, magnetoresistive values were measured at room temperature with external magnetic fields which were varied in the range of −1000 to +1000 Oe, to obtain magnetoresistance ratios similarly to Example 1. FIG. 6 shows the results, along with the result of comparative example 2.

Table 2 shows the maximum MR ratios and operating magnetic fields of the magnetoresistive elements according to Example 2 and comparative examples 2 and 3.

TABLE 2

|  | Example 2 | Comparative Example 2 | Comparative Example 3 |
| --- | --- | --- | --- |
| Maximum MR Ratio (%) | 32 | 2 ~ 3 | 19.4 |
| Operating Magnetic Field (Oe) | 85 | ~10 | 3000 |

As clearly understood from FIG. 6, the magnetoresistive element according to Example 2 exhibits an extremely high MR ratio.

As clearly understood from Table 2, further, the maximum MR ratio of Example 2 is about 30%, which is remarkably larger as compared with those of about 3% and about 20% of comparative examples 2 and 3. It is also understood that the operating magnetic field of Example 2 is about 85 Oe, which is sufficiently smaller than that of about 3000 Oe of comparative example 3, but which is slightly larger than that of about 10 Oe of comparative example 2. In addition, the maximum MR ratio and the operating magnetic field of the magnetoresistive film according to Example 2 are larger and smaller than those of the aforementioned conventional magnetoresistive film consisting of Co and Cu respectively. Further, no Barkhausen noise was caused in the magnetoresistive element according to Example 2 either.

While a method of forming the magnetoresistive film provided in the inventive magnetoresistive element is not particularly restricted, it is possible to form this film by irradiating the substrate with a magnetic material consisting of ferromagnetic metal atoms or a ferromagnetic metal alloy by a vacuum thin film forming method with a constant luminous energy and also irradiating the substrate with a non-magnetic conductive metal film similarly by a vacuum thin film forming method while continuously varying the luminous energy. Alternatively, the substrate may be irradiated with the non-magnetic conductive material with a constant luminous energy, while also being irradiated with the magnetic material consisting of the ferromagnetic metal atoms or the ferromagnetic metal alloy with a continuously varied luminous energy.

Further, the substrate may be irradiated with the magnetic material with a continuously varied luminous energy while also being irradiated with the non-magnetic conductive metal with a luminous energy which is continuously varied reversely to that for the magnetic material, so that a magnetoresistive film having a prescribed distribution of grain concentration is formed thereon.

Figure 8:
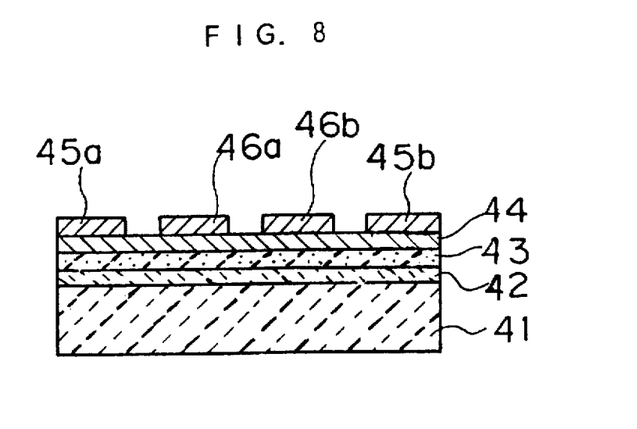
Figure 9:
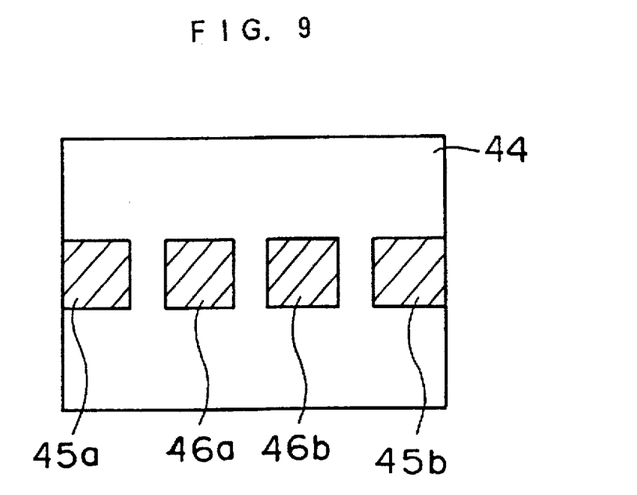
FIG. 9 is a plan view showing the exemplary magnetoresistive element according to the present invention.

FIGS. 8 and 9 are a sectional view and a plan view showing an exemplary magnetoresistive element according to the present invention. Referring to FIGS. 8 and 9, a substrate is formed by an alumina plate 41 containing TiC which is dispersed therein, an $Al_2O_3$ film 42 which is provided on the alumina plate 41, and an $SiO_2$ film 13 which is provided on the $Al_2O_3$ film 42. A magnetoresistive film 44 is formed on the $SiO_2$ film 43. Current feeding electrodes 45a and 45b are provided on the magnetoresistive film 44, in order to feed a current through the magnetoresistive film 44. Further, voltage reading electrodes 46a and 46b are provided between the current feeding electrodes 45a and 45b, to detect the resistance of the magnetoresistive film 44. The current feeding electrodes 45a and 45b and the voltage reading electrodes 46a and 46b can be formed by metal multilayer films of Ti/Au/Ti, for example. A current is fed through the magnetoresistive film 44 by the current feeding electrodes 45a and 45b, so that the magnetoresistance ratio in the magnetoresistive film 44 is detected by the voltage reading electrodes 46a and 46b. It is possible to measure a change in the strength of a magnetic field which is applied to the magnetoresistive film 44 by detecting the magnetoresistance ratio.

Although the grain concentration is continuously varied in the magnetoresistive film in each of the aforementioned embodiments, the present invention is not restricted to this but the grain concentration may alternatively be varied stepwise along the film thickness direction.

Figure 10:
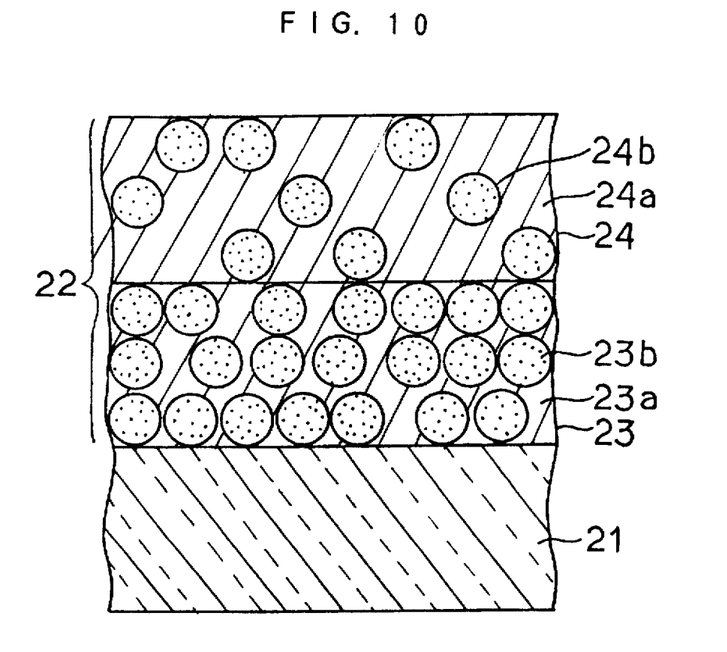
FIG. 10 is a typical sectional view showing a magnetoresistive film provided in a magnetoresistive element according to a third embodiment of the present invention.

FIG. 10 shows a magnetoresistive film provided in a magnetoresistive element according to a third embodiment of the present invention, in which the grain concentration is varied in two stages. Referring to FIG. 10, a magnetoresistive film 22 consisting of first and second layers 23 and 24 which are respectively stacked with each other in sequence is formed on a substrate 21. In the first layer 23, grains 23b consisting of a magnetic material are dispersed in a conductive metal film 23a. Also in the second layer 24, grains 24b consisting of a magnetic material are dispersed in a non-magnetic conductive metal film 24a. The grain concentration of the second layer 24 is lower than that of the first layer 23. Thus, the grain concentration may be varied stepwise.

Figure 11:
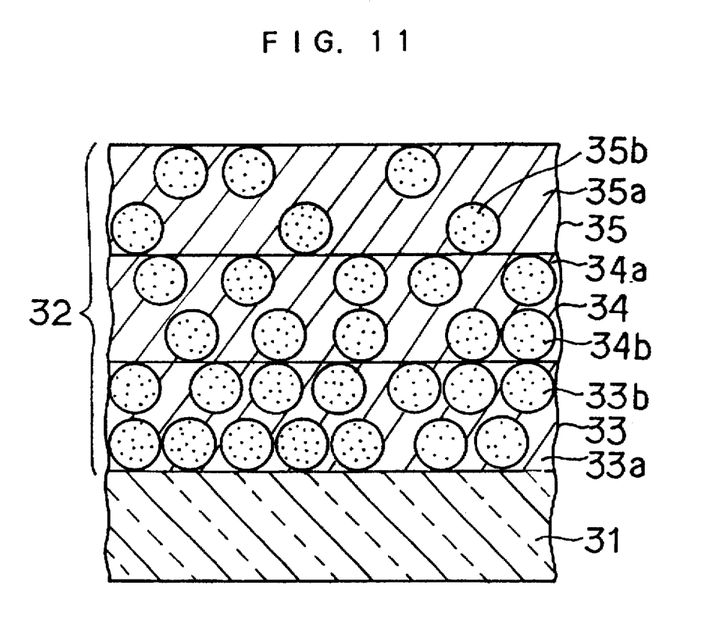
FIG. 11 is a typical sectional view showing a magnetoresistive film provided in a magnetoresistive element according to a fourth embodiment of the present invention.

FIG. 11 is a sectional view showing a magnetoresistive film provided in a magnetoresistive element according to a fourth embodiment of the present invention, in which the grain concentration is varied in three stages. Referring to FIG. 11, a magnetoresistive film 32 consisting of first, second and third layers 33, 34 and 35 which are respectively stacked with each other in sequence is formed on a substrate 31. In the first layer 33, grains 33b consisting of a magnetic material are dispersed in a non-magnetic conductive metal film 33a. Also in the second layer 34, grains 34b consisting of a magnetic material are dispersed in a non-magnetic conductive metal film 34a. Also in the third layer 35, further, grains 35b consisting of a magnetic material are dispersed in a non-magnetic conductive film 35a. The grain concentration is reduced along the thickness direction from the first layer 33 toward the third layer 35, i.e. in a direction away from the substrate 31. In the magnetoresistive film 32, therefore, the grain concentration is varied in three stages along the film thickness direction. Thus, the grain concentration may be varied stepwise.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetoresistive element comprising:

a substrate;

a magnetoresistive film arranged directly on and in contact with said substrate and consisting of a non-magnetic conductive metal film and grains consisting of a ferromagnetic metal atom or a ferromagnetic metal alloy dispersed in said metal film, wherein a concentration of said grains increases or decreases from a first side of said magnetoresistive film adjacent said substrate to a surface of said magnetoresistive film opposite said first side;

a pair of current feeding electrodes arranged on said magnetoresistive film; and a pair of voltage reading electrodes arranged on said magnetoresistive film; and wherein said substrate is relatively nonconducting as compared with said magnetoresistive film.

2. The magnetoresistive element in accordance with claim 1, wherein said non-magnetic conductive metal and said ferromagnetic metal atom or said ferromagnetic metal alloy of said magnetoresistive film have a eutectic relation to each other.

3. The magnetoresistive element in accordance with claim 2, wherein said grains consist of said ferromagnetic metal atom, which is Co, and said non-magnetic conductive metal is Cu.

4. The magnetoresistive element in accordance with claim 1, wherein said non-magnetic conductive metal and said ferromagnetic metal atom or said ferromagnetic metal alloy are insoluble with each other in both solid and liquid phases.

5. The magnetoresistive element in accordance with claim 4, wherein said non-magnetic conductive metal is Ag, and wherein said grains consist of said ferromagnetic metal atom, which is Co.

6. The magnetoresistive element in accordance with claim 4, wherein said non-magnetic conductive metal is Ag, and wherein said grains consist of said ferromagnetic metal alloy, which is NiFe.

7. The magnetoresistive element in accordance with claim 1, wherein said grain concentration in said magnetoresistive film is varied substantially continuously from said first side to said surface.

8. The magnetoresistive element in accordance with claim 1, wherein said grain concentration in said magnetoresistive film is varied substantially stepwise from said first side to said surface.

9. The magnetoresistive element in accordance with claim 1, wherein said grain concentration in said magnetoresistive film is at a higher level at said first side and is gradually reduced therefrom to a lower level at said surface.

10. The magnetoresistive element in accordance with claim 1, wherein said grain concentration in said magnetoresistive film is at a lower level at said first side and is gradually increased therefrom to a higher level at said surface.

11. The magnetoresistive element in accordance with claim 1, exhibiting a magnetoresistance ratio of at least about 18% at room temperature, an operating magnetic field of at most 52 Oe, and no Barkhausen noise.

12. The magnetoresistive element in accordance with claim 1, exhibiting a magnetoresistance ratio of at least about 30% at room temperature, an operating magnetic field of at most 85 Oe, and no Barkhausen noise.

13. The magnetoresistive element in accordance with claim 1, wherein said grains have a grain size so as to form a single magnetic domain.

14. The magnetoresistive element in accordance with claim 1, wherein said grains have grain diameters on the order of several tens of Angstroms.

15. The magnetoresistance effect element in accordance with claim 1, wherein said substrate consists of a non-magnetic, non-conductive material.

16. A magnetoresistive element comprising:

a substrate; and a magnetoresistive film arranged directly on and in contact with said substrate;

wherein said magnetoresistive film consists of a non-magnetic conductive metal matrix and ferromagnetic material grains dispersed in said matrix, with a concentration of said grains in said matrix varying monotonically along a concentration gradient from a first side of said film adjacent said substrate to a second side of said film opposite said substrate, and wherein said substrate is relatively nonconducting as compared with said magnetoresistive film.

17. The magnetoresistive element in accordance with claim 16, wherein said concentration gradient is a substantially linear variation of said concentration from said first side to said second side.

18. The magnetoresistive element in accordance with claim 16, wherein said concentration gradient is a stepwise variation of said concentration from said first side to said second side.

19. The magnetoresistive element in accordance with claim 18, wherein said matrix consists of a plurality of matrix layers with a respective different concentration of said grains in each of said layers, wherein said respective concentration of said grains in each of said layers is substantially uniform in said layer.

20. The magnetoresistive element in accordance with claim 16, wherein said concentration of said grains is about 100% at said first side adjacent said substrate.

21. The magnetoresistance effect element in accordance with claim 15, wherein said magnetoresistive film is formed directly on said substrate.

22. The magnetoresistance effect element in accordance with claim 16, wherein said substrate consists of a non-magnetic, non-conductive material.

23. The magnetoresistance effect element in accordance with claim 22, wherein said magnetoresistive film is formed directly on said substrate.

24. A magnetoresistive element comprising:

a substrate;

a magnetoresistive film arranged directly on and in contact with said substrate and consisting of a non-magnetic conductive metal film and grains consisting of a ferromagnetic metal atom or a ferromagnetic metal alloy dispersed in said metal film, wherein a concentration of said grains increases or decreases through a thickness of said magnetoresistive film from a first side thereof adjacent said substrate to a second side thereof opposite said substrate;

and wherein said substrate is relatively nonconducting as compared with said magnetoresistive film; and a pair of electrodes arranged in contact with said magnetoresistive film.

* * * * *

UNITED STATES PATENT AND TRADEMARK OFFICE
CERTIFICATE OF CORRECTION

PATENT NO. : 5,736,921
DATED : Apr. 7, 1998
INVENTOR(S) : Maeda et al.

It is certified that error appears in the above-identified patent and that said Letters Patent is hereby corrected as shown below:

On the Title Page, Page 2, under "U. S. PATENT DOCUMENTS"
  line 1, replace "Grüberg" by --Grünberg--;
  line 12, delete "5,287,553  2/1994  Ahn et al.";

On the Title Page, Page 2, under "OTHER PUBLICATIONS"
  lines 7 and 8, delete "J. Smyth et al. "Hysteresis in Lithographic Arrays...", J. Appl. Phys. Apr. 1994, vol. 69, no. 8. pp. 5262-5266.".

In the Drawings:  In Fig. 3, replace "RATIO (%)" by --MR RATIO (%);
     replace "EXAMPMPLE" by --EXAMPLE--.
  In Fig. 6, replace "RATIO (%)" by --MR RATIO (%);
     replace "EXAMPMPLE" by --EXAMPLE--.

Col. 1, line 56,  after "film" insert --or--.
Col. 3, line 60,  after "in" insert --Ag.--.
Col. 6, line 46,  replace "toresistive" by --toresistance--.
Col. 7, line 41,  replace "film 13" by --film 43--.

Signed and Sealed this

Seventh Day of July, 1998

*Attest:*

BRUCE LEHMAN

*Attesting Officer*          *Commissioner of Patents and Trademarks*